United States Patent [19]

Uchiyama

[11] Patent Number: 4,943,486
[45] Date of Patent: Jul. 24, 1990

[54] COATED ARTICLE AND METHOD OF PRODUCTION

[75] Inventor: Akira Uchiyama, Nagano, Japan

[73] Assignee: Seiko Epson Corporation, Tokyo, Japan

[21] Appl. No.: 176,124

[22] Filed: Mar. 31, 1988

[30] Foreign Application Priority Data

Apr. 1, 1987 [JP] Japan .................................. 62-80615
Apr. 1, 1987 [JP] Japan .................................. 62-80617

[51] Int. Cl.$^5$ ...................... B23K 26/00; C23C 14/06; C23C 16/34; G04B 37/22
[52] U.S. Cl. ...................................... 428/469; 428/698
[58] Field of Search ............... 428/469, 688, 698, 699

[56] References Cited

U.S. PATENT DOCUMENTS 4,735,856 5/1988 Schultz et al. ............... 427/419.2 X

FOREIGN PATENT DOCUMENTS 278300 12/1985 Japan .

*Primary Examiner*—Nancy A. B. Swisher
*Attorney, Agent, or Firm*—Blum Kaplan

[57] ABSTRACT

A coated article having a silver colored ornamental appearance is provided. The coated article includes a layer of pure, active metallic chromium coated on a substrate and an outer layer of chromium nitride carbide on the chromium layer. Intermediate mixed layers including metallic chromium, chromium nitride, chromium carbide and chromium nitride carbide may also be provided. The plating layers adhere strongly to the substrate. The coated article has good wear and mar resistant properties and a color tone similar to that of stainless steel.

21 Claims, 1 Drawing Sheet

COATED ARTICLE AND METHOD OF PRODUCTION

BACKGROUND OF THE INVENTION

This invention relates generally to coated articles and in particular, to an article that is coated using an ion plating process and has a color tone similar to the color tone of stainless steel.

About 90% of coated ornamental articles such as watches are gold or silver in color. Stainless steel material is often used to make ornamental articles and is processed by abrasion to provide a color tone similar to that of silver.

However, stainless steel materials generally have a low Vickers hardness, specifically between about 180 and 200 Hv. As a result, the material becomes marred or scratched within a short period of time and the initial ornamental appearance is not maintained. Brass and nickel-silver can also be used to form coated articles and these materials are generally prime-coated with copper or nickel plating. The prime-coating is covered with a palladium alloy, rhodium, silver and the like to obtain silver colored coated articles. However, all of these materials have poor corrosion resistance.

When brass material is coated with a palladium alloy, rhodium, silver or the like by a wet plating process the plated material is only a few microns thick. This is disadvantageous because the coating readily wears away or is damaged through use and the ornamental appearance deteriorates. Additionally, palladium alloys, rhodium, silver and the like are expensive and a low cost ornamental coated article can not be provided.

Accordingly, it is desirable to provide a coating on an ornamental article which has a high degree of hardness and good wearing and mar proof properties and overcomes the shortcoming of the prior art.

SUMMARY OF THE INVENTION

Generally speaking, in accordance with the invention, a coated article having a silver colored ornamental appearance is provided. The coated article includes a layer of pure, active metallic chromium coated on a substrate and an outer layer of chromium nitride carbide on the chromium layer. In an alternate embodiment, the article includes a mixed layer of metallic chromium and chromium nitride carbide disposed on the layer of metallic chromium below the layer of chromium nitride carbide. In another alternate embodiment, the coated article includes a first mixed nitride layer of metallic chromium and chromium nitride on the metallic chromium layer, a layer of chromium nitride on the first mixed layer, and a second mixed nitride layer of chromium nitride and chromium nitride carbide on the layer of chromium nitride below the layer of chromium nitride carbide. In a further alternate embodiment, the article includes a first mixed carbide layer of metallic chromium and chromium carbide on the metallic chromium layer, a layer of chromium carbide on the first mixed layer and a second mixed carbide layer of chromium carbide and chromium nitride carbide on the layer of chromium carbide below the layer of chromium nitride carbide. The plating layers adhere strongly to the substrate. The coated article has good wear and mar resistant properties and a color tone similar to that of stainless steel.

Accordingly, it is an object of the invention to provide an improved coated article.

Another object of the invention is to provide a coated article having a color tone similar to that of stainless.

A further object of the invention is to provide an ornamental coated article at a low cost.

Another object of the invention is to provide an ornamental coated article having a high degree of hardness.

A further object of the invention is to provide a coated article having good wearing properties.

Yet another object of the invention is to provide an ornamental coated article that is mar resistant.

Still another object of the invention is to provide an ornamental coated article having a coating of at least metallic chromium and chromium nitride carbide.

Still other objects and advantages o the invention will in part be obvious and will in part be apparent from the specification.

The invention accordingly comprises the several steps and the relation of one or more of such steps with respect to each of the others, and the article possessing the features, properties and the relation of elements, which are exemplified in the following detailed disclosure, and the scope of the invention will be indicated in the claims.

DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
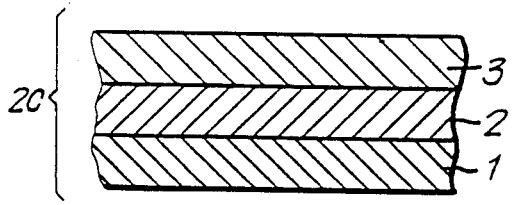
FIG. 1 is a cross-sectional view of a coated article constructed and arranged in accordance with the invention.

Coated articles prepared in accordance with the invention have an initial layer of pure, active metallic chromium disposed on a substrate by ion plating. This enables the next coating layer to adhere strongly to the substrate. Suitable substrates include any material that can withstand the heat generated during an ion plating process. Exemplary substrates include, but are not limited to, ceramic, cemented carbide, nickel group alloys, cobalt group alloys, stainless steel, copper alloys, zinc, zinc alloys, plastic and the like.

The selected substrate should have good corrosion resistance since a hard coating film produced by an ion plating process has pin holes which will cause corresponding pin holes to be generated in the coating film. Ceramic, carbide, nickel group alloys, cobalt group alloys, stainless steel and the like have good corrosion resistance. These substrates may be used either with or without a prime plating prior to coating the substrate with metallic chromium.

Stainless steel substrates which have components with good cutting properties such as sulphur have inferior corrosion resistance. Consequently, gold, gold alloys, palladium, palladium alloys, ruthenium or rhodium plating is prime coated on the substrate in one or more layers prior to coating the substrate with metallic chromium. Corrosion is prevented by using this extra plating layer.

When the substrate is formed of a copper alloy, zinc, a zinc alloy or active copper, nickel or a nickel alloy is prime coated on the substrate in a single layer or several layers. Gold, gold alloy, palladium, palladium alloy, rhodium, ruthenium or the like is then coated on the prime coated surface in a single layer or several layers in order to maintain the corrosion resistance. This makes it possible to prevent the substrate material from being directly exposed to high temperatures and high vacuum during the ion plating process. It also prevents the temperature inside the substrate from rising and prevents swelling generated by zinc vapor due to the rise in temperature.

Plastic substrates are treated similarly to substrates of copper alloy, zinc and zinc alloy. Since plastic substrates have a low melting point and are organic material, gases tend to be emitted when the temperature rises during the ion plating process. As a result, adherence of the coating film is inferior unless a prime plating is used. Nickel substrates are generally treated by non-electrode plating prior to prime plating.

The prime plating layer should have a thickness between about 2 and 10 $\mu m$ independent of whether the layer is formed of one or more layers. However, thicknesses between about 0.2 and 2.0 $\mu m$ can also be used and do not affect the basic quality of the coated article.

A pure and active metallic chromium layer is formed on the prime plated substrate by an ion plating process. The chromium layer increases adherence between the prime plated substrate and the hard coating film.

In one embodiment of the invention, chromium nitride carbide is formed directly on the metallic chromium layer by a chemical reaction between metallic chromium, acetylene gas and nitrogen gas. Coated articles having this two layer construction are particularly useful for example, as ornamental members for a watch or timepiece.

In an alternate embodiment, a three layer construction is provided. This three layer construction exhibits improved adherence between the layers than the two layer construction. The three layer construction includes the metallic chromium layer on the substrate or prime plated substrate, a mixed layer of metallic chromium and chromium nitride carbide on the metallic chromium layer and a layer of chromium nitride carbide on the mixed layer. The mixed layer transmits stress generated by mechanical strain or thermal damage to the coating film and the metallic chromium layer serves as an absorbent or buffer layer.

In a third alternate embodiment which has even greater adherence between the layers, the coating has a five layer construction. The five layer construction includes the pure, active metallic chromium layer formed on the substrate or a prime coated substrate, the first mixed layer of metallic chromium and chromium nitride on the metallic chromium layer, the chromium nitride layer on the first mixed layer, a second mixed layer of chromium nitride and chromium nitride carbide on the chromium nitride layer and a chromium nitride carbide layer on the second mixed layer. This construction makes it possible to reduce the stress differential between the layers.

A fourth alternate embodiment is similar, but uses chromium carbide in place of the chromium nitride. Specifically, the pure, active metallic chromium layer is formed on the substrate or prime coated substrate, a first mixed layer of metallic chromium and chromium carbide is formed on the metallic chromium layer, a chromium carbide layer is formed on the first mixed layer, a second mixed layer of chromium carbide and chromium nitride carbide is formed on the chromium carbide layer and a chromium nitride carbide layer is formed on the second mixed layer.

The third and fourth embodiments significantly improve adherence of the hard coating film to the substrate. The mixed regions function to transmit stress against mechanical strain or thermal damage and the metallic chromium layer serves as an absorbent or buffer layer. The color tone of the hard coating film is determined substantially by the chromium nitride carbide layer on the outside and is not affected by the additional layers in the construction.

The hardness of the chromium nitridecarbide coating film is greater than about 1500 Hv due to production of the coating film by an ion plating process. Accordingly, damage is readily prevented and the coating film has practical utility.

The color tone of the coating film is glossy metallic and similar to that of stainless steel. When the coating film is applied to an ornamental member of a timepiece for example, the ornamental member and other members formed of stainless material are not visually out of place. Additionally, the coating film can be used on an entire portable timepiece including a watch band or other portion which is easily damaged. For optimum color tone and hardness, the chromium nitride carbide layer has a thickness between about 0.15 and 3.0 $\mu m$.

For hard coating chromium nitride carbide films having thicknesses between about 0.15 and 3.0 $\mu m$, the color spaces L*, a* and b* identified by JIS Z8105-2068 (CIE 1976), are represented by $65\% \leq L^* \leq 90\%$, $-3 \leq a^* \leq 5$ and $-5 \leq b^* \leq 10$.

The L* value is preferably in the range between about 65 and 90% and more preferably in the range between about 72 and 83%. The hard coating film has a color tone similar to that of stainless steel and metallic glossy when the color tone is represented by these formulas. When the L* value is too low the brightness of the hard coating film is low and the coating is dark. Consequently, sufficient glossiness is not achieved. On the other hand, when the L* value is too high the brightness is too high and the coating film is too glossy.

The value of a* is preferably in the range between about $-3$ and 5, and more preferably in the range between about $-1$ and 2. The color tone becomes greenish when the value of a* is too low and the color tone becomes reddish when the value of a* is too high.

The value of b* is preferably in the range between about $-5$ and 10 and more preferably in the range between about $-1$ and 6. The color tone becomes bluish when the value of b* is too low and the color tone becomes yellowish when the value of b* is too high.

The chromium nitride carbide hard coating film is formed of a chromium compound, carbon and nitrogen and is produced by an ion plating process wherein chromium or a chromium alloy serves as a vaporization source and nitrogen gas and a hydrocarbon such as acetylene are the reactive gases. The hard coating film may also be formed from compounds of chromium, carbon, nitrogen and oxygen. Such a hard coating film is produced by introducing a small amount of oxygen to the nitrogen and hydrocarbon gases during the ion plating process.

It is preferable for the thickness of the hard coating film to be in the range between about 0.15 and 5.0 μm. Coating films having thicknesses within this range are easy to produce and have good wearing properties, mar proof properties and adherence. Preferable, the thickness is between about 1 and 2 μm. In addition to ion plating, sputtering, chemical vapor deposition, plasma chemical deposition and the like may be used to prepare hard coating films in accordance with the invention.

The invention will be better understood with reference to the following Examples. These Examples are presented for purposes of illustration only and are not intended to be construed in a limiting sense.

EXAMPLES 1-8 AND COMPARATIVE EXAMPLES 1-5

Reference is made to FIG. 1 which is a cross-sectional view of a coated article 20 constructed and arranged in accordance with the invention. Coated article 20 includes a substrate 1, a metallic chromium layer 2 on substrate 1 and a chromium nitride carbide layer 3 on chromium layer 2. Substrates 1 were selected from SUS 304, SUS 316L, SUS 303B, brass or zinc as shown in Table 1A and the substrates were prime plated with the materials indicated and maintained in a vacuum chamber. Argon gas was introduced into the vacuum chamber and maintained at a pressure of about 0.02 torr. A charge of −0.5 kv was applied to the substrate and the substrate was bombarded with ionized gas for a period of about 5 minutes to clean the surface. The argon gas was discharged and the pressure of the vacuum chamber returned to $1 \times 10^{-4}$ torr.

Metallic chromium was vaporized by electron beam heating and a charge of −0.1 kv was applied to the substrate to generate a plasma. As a result, ionized metallic chromium layer 2 was deposited on substrate 1.

Nitrogen gas and acetylene gas were rapidly introduced into the vacuum chamber in a predetermined ratio until a predetermined pressure was achieved inside the chamber. When the pressure of the mixed gas became uniform, ion plating was conducted for a predetermined period of time and an outer layer 3 of chromium nitride carbide was formed on metallic chromium layer 2.

Table 1A shows the substrates and coating conditions for each of Examples 1-8 and Comparative Examples 1-5.

TABLE 1A

| property Sample | | material | prime-coating | Forming a coating or layer | | |
|---|---|---|---|---|---|---|
| | | | | treating time (min.) | $N_2/C_2H_2$ (ratio) | gas pressure (torr) |
| Embodiments of the Present Invention | 1 | SUS 304 | not including | 12 | 1.0 | $5 \times 10^{-4}$ |
| | 2 | SUS 304 | not including | 34 | 3.0 | $5 \times 10^{-4}$ |
| | 3 | SUS 316L | not including | 19.5 | ⅓ | $5 \times 10^{-4}$ |
| | 4 | SUS 303B | including | 30 | 1/7 | $2 \times 10^{-4}$ |
| | 5 | SUS 303B | including | 9.5 | 7.0 | $9 \times 10^{-4}$ |
| | 6 | brass | including | 44 | 10.1 | $6 \times 10^{-4}$ |
| | 7 | brass | including | 50 | 1/10 | $6.5 \times 10^{-4}$ |
| | 8 | zinc | including | 20.5 | 1.0 | $6 \times 10^{-4}$ |
| Comparative Embodiment | 1 | SUS 304 | not including | 9.2 | ⅓ | $1 \times 10^{-3}$ |
| | 2 | SUS 316L | not including | 33 | 1.0 | $8 \times 10^{-5}$ |
| | 3 | SUS 303B | including | 43 | $N_2$ only | $9 \times 10^{-4}$ |
| | 4 | brass | including | 56 | $C_2H_2$ only | $9 \times 10^{-4}$ |
| | 5 | brass | including | 1.5 | 1.0 | $5 \times 10^{-4}$ |

Example 4 and Comparative Example 3 had a prime coating of 0.1 μm 24 k Au+3 μm 80 wt % Pd−20 wt % Ni alloy.

Example 5 had a prime coating of 0.1 μm 24 k Au+2 μm 23 k Au−Ni.

Example 6 and Comparative Example 4 had a prime coating of 4 μm Cu+4 μm Ni+3 μm 80 wt % Pd−20 wt % Ni alloy.

Example 7 and Comparative Example 5 had a prime coating of 3 μm Ni+2 μm 22 k Au−Ni+0.1 μm Rh.

Example 8 had a prime coating of 10 μm Cu+5 μm Ni+1 μm 24 k Au.

Treatment time refers to the amount of time that chromium was vaporized during the ion plating process. $N_2/C_2H_2$ ratio is the flow ratio between $N_2$ and $C_2H_2$ at uniform pressure when the CrNC layer was formed.

Gas pressure is the pressure in the vacuum chamber when the combination of gases ($N_2$ and $C_2H_2$) was stabilized.

Table 1B shows the formation time and thickness of each of metallic chromium layer 2 and chromium nitride carbide layer 3 of Examples 1-8 and Comparative Examples 1-5.

TABLE 1B

| Properties (layer No.) Samples | | First layer 2 | | second layer 3 | |
|---|---|---|---|---|---|
| | | forming time (min.) | film thickness (μm) | forming time (min.) | film thickness (μm) |
| Embodiments of the Present Invention | 1 | 4.0 | 0.4 | 0.4 | 0.9 |
| | 2 | 10.0 | 1.0 | 24 | 2.5 |
| | 3 | 0.5 | 0,05 | 19 | 2.0 |
| | 4 | 20 | 2.0 | 10 | 0.9 |
| | 5 | 8.5 | 0.8 | 1.0 | 0.1 |
| | 6 | 15 | 1.5 | 29 | 3.0 |
| | 7 | 20 | 2.0 | 30 | 3.0 |
| | 8 | 5.5 | 0.5 | 15 | 1.5 |
| Comparative Embodiments | 1 | 0.2 | 0.01 | 9.0 | 0.9 |
| | 2 | 24 | 2.5 | 9.0 | 0.9 |
| | 3 | 10 | 1.0 | 33 | 3.2 |

TABLE 1B-continued

| Properties (layer No.) Samples | First layer 2 forming time (min.) | film thickness (μm) | second layer 3 forming time (min.) | film thickness (μm) |
| --- | --- | --- | --- | --- |
| 4 | 26 | 2.5 | 30 | 3.0 |
| 5 | 0.6 | 0.05 | 0.9 | 0.08 |

Table 2 shows the properties of the hard coating films of each of Examples 1-8 and Comparative Examples 1-5.

Exfoliation of the hard coating film at the bent portion is examined.

Abrasion is measured by adhering a timepiece case having a hard coating film on one side of a piece of cowhide so that the hard coating film was exposed. A 500 grams load was applied to the hard coating film on the timepiece case and was reciprocally worn 30,000 times using a 10 cm stroke.

Corrosion resistance was measured by soaking a half lower portion of a timepiece case in synthetic sweat or artificial sea water (3% NaCl) at a temperature of 40° C. and humidity of 90% for 20 hours. The corrosion or

TABLE 2

| property Sample | | Property of a coating layer | | | | Evaluation Properties | | | | | |
| --- | --- | --- | --- | --- | --- | --- | --- | --- | --- | --- | --- |
| | | film thickness (μm) | hardness (Hv) | color tone L* (%) | a* | Evaluation or color tone | Adhesiveness | mar-proof property | corrosin resistance synthetic sweat | artificial seawater | hardness |
| Embodiments of the Present Invention | 1 | 1.3 | 1500 | 83 | −0.1 | 2.6 | ⊙ | ⊙ | ⊙ | ⊙ | ⊙ | ⊙ |
| | 2 | 3.5 | 2000 | 83 | −1.0 | −1.0 | ⊙ | ⊙ | ⊙ | ⊙ | ⊙ | ⊙ |
| | 3 | 2.05 | 2000 | 83 | 2.0 | 6.0 | ⊙ | ○ | ⊙ | ⊙ | ⊙ | ⊙ |
| | 4 | 2.9 | 1200 | 90 | 3.0 | 8.0 | ○ | ⊙ | ⊙ | ⊙ | ⊙ | ○ |
| | 5 | 0.9 | 1000 | 65 | −2.0 | −3.5 | ○ | ⊙ | ⊙ | ⊙ | ⊙ | ○ |
| | 6 | 4.5 | 2100 | 82 | −3.0 | 5.0 | ○ | ⊙ | ⊙ | ⊙ | ⊙ | ⊙ |
| | 7 | 5.0 | 2100 | 77 | 5.0 | 10.) | ○ | ○ | ⊙ | ⊙ | ⊙ | ⊙ |
| | 8 | 2.0 | 1600 | 80 | −0.3 | 2.8 | ⊙ | ⊙ | ⊙ | ⊙ | ⊙ | ⊙ |
| Comparative Embodiment | 1 | 0.91 | 1500 | 62 | 1.0 | 4.0 | X black | X | ⊙ | ⊙ | ⊙ | ⊙ |
| | 2 | 3.4 | 900 | 91 | <0.2 | 2.8 | X glittering | ⊙ | ⊙ | ⊙ | ⊙ | Δ |
| | 3 | 4.2 | 2100 | 65 | −3.4 | −5.5 | X bluish green | ⊙ | ⊙ | ⊙ | ⊙ | ⊙ |
| | 4 | 5.5 | 2100 | 67 | 5.6 | 12.1 | X redish yellow | X | ⊙ | ⊙ | ⊙ | ⊙ |
| | 5 | 0.13 | 800 | 93 | −0.2 | 2.8 | X interference color | ⊙ | ⊙ | ⊙ | ⊙ | X |

The following chart shows the meaning of the symbols used in Table 2.

| symbol | property | | | | |
| --- | --- | --- | --- | --- | --- |
| | color tone | abrasion | adherence | corrosion resistance | hardness |
| ⊙ | color tone within the adequate range | no abrasion | no exfoliation | no corrosion | Hv 1200 or more |
| ○ | withing the substantially adequate range | scarecely abrasion or no exposure of material | scarecely exfoliation | scarecely corrosion | Hv 1200 ~ Hv 1000 |
| Δ | out of the adequate range a little | partial exposure of material | a little of partial exfloliation | a little or partial corrosion | Hv 1000 ~ Hv 900 |
| X | out of the adequate range fairly | all exposure of material | all or almost exfoliation | all or almost corrosion | less than 900 |

Color tone of the hard coating films are determined at a predetermined value wherein a standard light C, defined by JIS Z 8105-2014 is used. The reflective rate of the spectral defraction defined by JIS Z 8105-1013 is determined and the value is converted to the color spaces L*, a* and b* (CIE 1976).

The color tone is also examined with the naked eye and is compared to the color tone of stainless steel.

To determine adherence, pressure is applied to both ends of a timepiece case using a vice so that a portion of the timepiece case is bent at an angle of greater than 90°.

color change was examined.

Hardness was measured using a 10 gram load.

Thickness of the hard coating film is measured using a measuring device of Kosaka Kenkyusha. A portion of the hard coating was shadowed, an ion plating film was formed on the entire coating layer, the shadowing was removed and the height of the ion plated film was measured at the portion where the shadowing is removed.

The total film thickness should be in the range between about 0.15 and 5 μm. When the thickness is outside of this range, as shown in Comparative Examples 4 and 5, adequate color tone and hardnesses of greater than 1,000 Hv can not be obtained.

Additionally, it is desirable for the thickness of the metallic chrome layer to be between about 0.05 and 2.0 μm. The metallic chromium layers of Comparative Examples 1, 2 and 4 are outside of this range.

The thickness of the chromium nitride carbide layer is preferably between about 0.1 and 3.0 μm.

Furthermore, as can be seen in Comparative Example 1 the brightness, $L^*$ of the hard coating film is low when teh gas pressure becomes too high. Specifically, $L^*$ was 62% at a gas pressure of $1 \times 10^{-3}$ torr, which indicates a dark, non-glossy appearance.

On the other hand as shown in Comparative Example 2, $L^*$ became too high when the gas pressure was extremely low. Specifically, at a gas pressure of $8 \times 10^{-5}$ torr, $L^*$ became about 91% which indicated that the hard coating film was extremely bright and the appearance was dazzling. In either case, the hard coating was not suitable for an ornamental coating on a timepiece.

$L^*$ is affected by the gas pressure because the gravity percent of nitrogen and acetylene gases in the composition ratio of chromium, nitrogen and acetylene becomes too great when the gas pressure is high. As a result, CrNC crystals are not combined stably and the hard coating film absorbs light, which causes pores to develop. Consequently, the value of $L^*$ is low and the hard coating film has a dark color tone. In contrast, the gravity percent of chromium in the composition ratio of chromium nitride carbide is high when the gas pressure is low. As result, the metallic chromium obtained by vapor deposition has a dazzling appearance. The value of $L^*$ is preferably in the range between about 65% and 90%.

Furthermore, when only nitrogen gas is used as a reactive gas the color tone of the coating film produced is made of CrN. The CrN coating film has a bluish tone as shown in Comparative Example 3.

When only acetylene gas is used a reactive gas, the coating film produced was CrC and had a reddish color tone.

EXAMPLES 9-16 AND COMPARATIVE EXAMPLES 6-12

Figure 2:
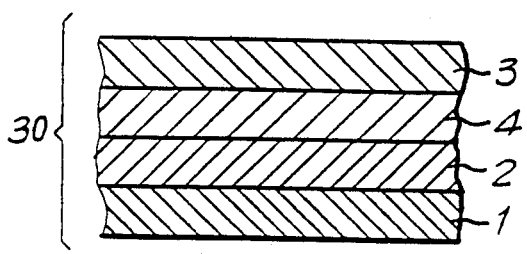
FIG. 2 is a cross-sectional view of a coated article constructed and arranged in accordance with an alternate embodiment of the invention.

Reference is made to FIG. 2 which is cross-sectional view of a coated article 30 constructed and arranged in accordance with the invention. Coated article 30 includes a substrate 1, a metallic chromium layer 2 on substrate 1, a mixed layer 4 of metallic chromium and chromium nitride carbide on chromium layer 2 and a chromium nitride carbide layer 3 on mixed layer 4.

The substrates were selected as shown in Table 3A and cleaned as described in Examples 1-8 and Comparative Examples 1-5 and a layer of metallic chromium was deposited on substrate 1 as described.

Nitrogen gas and acetylene gas were slowly introduced into a vacuum chamber in a predetermined ratio until a pre-determined pressure was achieved inside the chamber. Consequently, a mixed layer 4 of metallic chromium and chromium nitride carbide was deposited on metallic chromium layer 1. When the pressure became uniform, chromium nitride carbide layer 3 was formed on mixed layer 4 by ion plating.

Tables 3A and 3B show the formation time and thickness of each of coated layers 2, 4 and 3 of coated article 30 for each of Examples 9-16 and Comparative Examples 6-12.

TABLE 3A

| Property Samples | | Material | Prime-coating | Forming a coating layer Treating time (min.) | $N_2/C_2H_2$ | gas pressure (torr) |
|---|---|---|---|---|---|---|
| Embodiments of the Present Invention | 9 | SUS 304 | not including | 15 | 1.0 | $5 \times 10^{-4}$ |
| | 10 | SUS 304 | not including | 39 | 3.0 | $5 \times 10^{-4}$ |
| | 11 | SUS 316L | not including | 18.6 | ¼ | $5 \times 10^{-4}$ |
| | 12 | SUS 303B | including | 31.5 | 1/7 | $2 \times 10^{-4}$ |
| | 13 | SUS 303B | including | 15.6 | 7.0 | $9 \times 10^{-4}$ |
| | 14 | brass | including | 25.5 | 10.0 | $6 \times 10^{-4}$ |
| | 15 | brass | including | 17.0 | 1/10 | $6.5 \times 10^{-4}$ |
| | 16 | zinc | including | 50.5 | 1.0 | $6 \times 10^{-4}$ |
| Comparative Embodiments | 6 | SUS 304 | not including | 11.2 | ¼ | $1 \times 10^{-3}$ |
| | 7 | SUS 316L | not including | 37.5 | 1.0 | $8 \times 10^{-5}$ |
| | 8 | SUS 303B | including | 26.7 | $N_2$ only | $9 \times 10^{-4}$ |
| | 9 | brass | including | 32.0 | $C_2H_2$ only | $9 \times 10^{-4}$ |
| | 10 | brass | including | 7.4 | 1.0 | $5.0 \times 10^{-4}$ |
| | 11 | SUS 303B | not including | 39.0 | 1.0 | $6 \times 10^{-4}$ |
| | 12 | SUS 303B | not including | 53 | 1.0 | $6 \times 10^{-4}$ |

TABLE 3B

|  | Sample | first layer (2) forming time (min.) | first layer (2) film thickness (μm) | second layer (4) forming time (min.) | second layer (4) film thickness (μm) | third layer (3) forming time (min.) | third layer (3) film thickness (μm) |
| --- | --- | --- | --- | --- | --- | --- | --- |
| Embodiments of Present Invention | 9 | 4.0 | 0.4 | 2.5 | 0.2 | 8.5 | 0.9 |
|  | 10 | 10.0 | 1.0 | 3.0 | 0.3 | 26 | 2.5 |
|  | 11 | 0.6 | 0.05 | 2.0 | 0.2 | 16 | 1.5 |
|  | 12 | 21.0 | 2.0 | 1.0 | 0.1 | 9.5 | 0.9 |
|  | 13 | 5.0 | 0.5 | 0.6 | 0.05 | 10 | 1.0 |
|  | 14 | 5.5 | 0.5 | 5.0 | 0.5 | 15 | 1.5 |
|  | 15 | 5.0 | 0.5 | 1.5 | 0.1 | 10.5 | 0.1 |
|  | 16 | 19.0 | 1.8 | 2.0 | 0.2 | 29.5 | 3.0 |
| Comparative Embodiments | 6 | 0.2 | 0.01 | 1.0 | 0.1 | 10.0 | 1.0 |
|  | 7 | 26 | 2.5 | 1.5 | 0.1 | 10.0 | 0.9 |
|  | 8 | 5.5 | 0.5 | 0.2 | 0.01 | 21.0 | 2.0 |
|  | 9 | 5.0 | 0.5 | 6.5 | 0.6 | 20.5 | 2.0 |
|  | 10 | 5.5 | 0.5 | 1.0 | 0.1 | 0.9 | 0.08 |
|  | 11 | 5.0 | 0.5 | 1.0 | 0.1 | 33 | 3.2 |
|  | 12 | 21.0 | 2.0 | 2.0 | 0.2 | 30 | 3.0 |

The prime plating layers of Examples 12, 13, 14, 15 and 16 were the same as those of Examples 4, 5, 6, 7 and 8, respectively. The prime plating layers of Comparative Examples 8, 9 and 10 were the same as those of Comparative Examples 3, 4 and 5 respectively.

TABLE 4

Table 4 shows the properties of the hard coating films of each of Examples 9-16 and Comparatie Examples 6-12.

TABLE 4

| Property Samples |  | Properties of a Coating Film film thickness (μm) | Properties of a Coating Film hardness (Hv) | Color Tone L* (%) | Color Tone a* | Color Tone b* | Evaluation Properties Evaluation | Evaluation Properties Adhesive ness | Evaluation Properties mar-proof property | corrosin resis. Synthetic sweat | corrosin resis. artificial seawater | hardness |
| --- | --- | --- | --- | --- | --- | --- | --- | --- | --- | --- | --- | --- |
| Embodiments of the Present Invention | 9 | 1.5 | 1500 | 83 | p—0.1 | 2.6 | ⊚ | ⊚ | ⊚ | ⊚ | ⊚ | ⊚ |
|  | 10 | 3,8 | 2000 | 83 | −1.0 | −1.0 | ⊚ | ⊚ | ⊚ | ⊚ | ⊚ | ⊚ |
|  | 11 | 1.75 | 1700 | 83 | 2.0 | 6.0 | ⊚ | ○ | ⊚ | ⊚ | ⊚ | ⊚ |
|  | 12 | 3.0 | 1200 | 90 | 3.0 | 8.0 | ○ | ⊚ | ⊚ | ⊚ | ⊚ | ○ |
|  | 13 | 1.55 | 1500 | 65 | −2.0 | −3.5 | ○ | ○ | ⊚ | ⊚ | ⊚ | ⊚ |
|  | 14 | 2.5 | 1700 | 82 | −3.0 | −5.0 | ○ | ⊚ | ⊚ | ⊚ | ⊚ | ⊚ |
|  | 15 | 0.7 | 1000 | 77 | 5.0 | 10.0 | ○ | ⊚ | ⊚ | ⊚ | ⊚ | ○ |
|  | 16 | 5.0 | 2100 | 80 | −0.3 | 2.8 | ○ | ○ | ⊚ | ⊚ | ⊚ | ⊚ |
| Comparative Embodiments | 6 | 1.11 | 1400 | 62 | 1.0 | 4.0 | X black | X | ⊚ | ⊚ | ⊚ | ⊚ |
|  | 7 | 3.5 | 900 | 91 | −0.2 | 2.8 | X glittering | ⊚ | ⊚ | ⊚ | ⊚ | Δ |
|  | 8 | 2.51 | 2000 | 65 | −3.4 | −5.5 | X greenish yellow | ⊚ | ⊚ | ⊚ | ⊚ | ⊚ |
|  | 9 | 3.1 | 2000 | 67 | 5.6 | 12.1 | X redish yellow | ⊚ | ⊚ | ⊚ | ⊚ | ⊚ |
|  | 10 | 0.68 | 800 | 75 | −0.5 | 3.4 | ○ | ⊚ | ⊚ | ⊚ | ⊚ | X |
|  | 11 | 3.8 | 2100 | 80 | −0.3 | 2.8 | Δ clouded | Δ | ⊚ | ⊚ | ⊚ | ⊚ |
|  | 12 | 5.2 | 2100 | 80 | −0.3 | 2.8 | ○ | X | ⊚ | ⊚ | ⊚ | ⊚ |

The symbols have the same meanings as shown in connection with Table 2.

Color tone, adherence, abrasion, corrosion resistance, hardness and thickness were determined as described following Table 2. The total film thickness was between about 0.15 and 5 μm in order to obtain adequate color tone and a hardness of greater than about 1,000 Hv. Comparative Example 12 has a film thickness of 5.2 μm, which is greater than the desirable thickness.

In addition, the thickness of the metallic chromium layer should be between about 0.05 and 2.0 μm. Comparative Examples 6 and 7 have thicknesses which are not within this range. The thickness of the mixed layer show be between about 0.05 and 0.5 μm. Comparative Examples 8 and 9 have thicknesses outside of this range. Finally, the chromium nitride carbide layer show have a thickness between about 0.1 and 3.0 μm. Comparative Examples 10 and 11 have thicknesses outside of this range.

Additionally, when the gas pressure was too high as in Comparative Example 6, L* was too low and the coating film was dark and the appearance was not glossy. On the other hand, when the gas pressure was too low L* became very high, the brightness of the coating film was too great and the appearance was too dazzlingly. This is shown in Comparative Example 7.

Furthermore, use of only nitrogen gas as a reactive gas produced a CrN coating film having a bluish color as in Comparative Example 8. Use of acetylene gas only produced a hard coating film having a reddish color as in Comparative Example 9.

EXAMPLES 17-24 AND COMPARATIVE EXAMPLES 13-19

Figure 3:
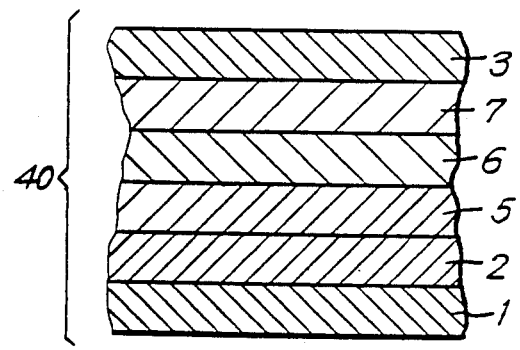
FIG. 3 is cross-sectional view of a coated article constructed and arranged in accordance with a further alternate embodiment of the invention.

Reference is made to FIG. 3 which is cross-sectional view of a coated article 40 constructed and arranged in accordance with another embodiment of the invention. Coated article 40 includes a substrate 1, a metallic chromium layer 2 on substrate 1, a first mixed layer 5 of metallic chromium and chromium nitride on metallic chromium layer 2, a layer of chromium nitride 6 on first mixed layer 5, a second mixed layer 7 of chromium nitride and chromium nitride carbide on chromium nitride layer 6, and a layer of chromium nitride carbide 3 on second mixed layer 7.

The substrates were selected of the materials shown in Table 5A and cleaned as described in Examples 1-8 and Comparative Examples 1-5. The substrates were prime coated as shown in Table 5A and a layer of metallic chromium was deposited on substrate 1 as described.

Nitrogen gas was gradually introduced into the vacuum chamber at a predetermined rate until the pressure indicated in Table 5 B was achieved. When the gas pressure stabilized, the layer produced was a mixed layer 5 of metallic chrome and chromium nitride. When the nitrogen gas pressure becomes constant, ion plating is again conducted for a predetermined period of time and a chromium nitride layer 6 was formed on mixed layer 5 of metallic chromium and chromium nitride. Then a mixed gas of chromium nitride and acetylene was gradually introduced into the vacuum chamber at a predetermined ratio and a second mixed layer 7 of chromium nitride and chromium nitride carbide is formed on chromium nitride layer 6. Finally, when the pressure of the mixed nitrogen and acetylene gas reached a predetermined value, ion plating was again conducted for a predetermined period of time and a chromium nitride carbide layer 3 was produced on second mixed layer 7 of chromium nitride and chromium nitride carbide.

Tables 5A and 5B show how the hard coating films of each of Examples 17-24 and Comparative Examples 13-19 were formed.

TABLE 5A

| Property Sample | | material | prime-coating | Forming a coating film | | |
|---|---|---|---|---|---|---|
| | | | | Treating time (min.) | $N_2/C_2H_2$ ratio | gas pressure (torr) |
| Embodiments of Present invention | 17 | SUS 304 | not including | 27 | 1.0 | $5 \times 10^{-4}$ |
| | 18 | SUS 304 | not including | 24.1 | 3.0 | $5 \times 10^{-4}$ |
| | 19 | SUS 316L | not including | 25.3 | 1/4 | $5 \times 10^{-4}$ |
| | 20 | SUS | including | 25.3 | 1/7 | $2 \times 10^{-4}$ |
| | 21 | SUS 303B | including | 37 | 7.0 | $9 \times 10^{-4}$ |
| | 22 | brass | including | 51 | 10.0 | $6 \times 10^{-4}$ |
| | 23 | brass | including | 23.5 | 1/10 | $6.5 \times 10^{-4}$ |
| | 24 | zinc | including | 52 | 1.0 | $6 \times 10^{-4}$ |
| Comparative Embodiments | 13 | SUS | not including | 23.8 | 1/2 | $1 \times 10^{-3}$ |
| | 14 | SUS 316L | not including | 39.7 | 1.0 | $8 \times 10^{-5}$ |
| | 15 | SUS 303B | including | 27.4 | $N_2$ only | $9 \times 10^{-4}$ |
| | 16 | brass | including | 49.1 | $C_2H_2$ only | $9 \times 10^{-4}$ |
| | 17 | brass | not including | 29.5 | 1.0 | $5 \times 10^{-4}$ |
| | 18 | SUS 303B | not including | 49.5 | 1.0 | $6 \times 10^{-4}$ |
| | 19 | SUS 303B | not including | 53 | 1.0 | $6 \times 10^{-4}$ |

TABLE 5B

| Property (layer No.) Sample | | First layre (2) | | Second layer (5) | | Third layer (6) | | Fourth layer (7) | | Fifth layer (3) | |
|---|---|---|---|---|---|---|---|---|---|---|---|
| | | forming time (min.) | thickness of film ($\mu$m) | forming time (min.) | thickness of film ($\mu$m) | forming time (min.) | thickness of film ($\mu$m) | forming time (min.) | thickness of film ($\mu$m) | forming time (min.) | thickness of film ($\mu$m) |
| Embodiments of Present Invention | 17 | 5.0 | 0.5 | 1 | 0.1 | 10 | 1.0 | 1 | 0.1 | 10 | 1.0 |
| | 18 | 0.6 | 0.05 | 1 | 0.1 | 11 | 1.0 | 1 | 0.1 | 10.5 | 1.0 |
| | 19 | 20 | 2.0 | 0.6 | 0.05 | 5 | 0.5 | 1.1 | 0.2 | 9 | 0.9 |
| | 20 | 10 | 1.0 | 6 | 0.5 | 20 | 2.0 | 0.6 | 0.05 | 8.5 | 0.9 |
| | 21 | 11 | 1.0 | 2.5 | 0.2 | 0.5 | 0.05 | 4 | 0.3 | 19 | 2.0 |
| | 22 | 6 | 0.5 | 2 | 0.2 | 31 | 3.0 | 2 | 0.2 | 10 | 1.0 |
| | 23 | 5 | 0.5 | 2 | 0.2 | 10 | 1.0 | 5.5 | 0.5 | 1 | 0.1 |
| | 24 | 5 | 0.5 | 1 | 0.1 | 14 | 1.3 | 1 | 0.1 | 31 | 3.0 |
| Comparative Embodiments | 13 | 0.2 | 0.01 | 1.5 | 0.1 | 11 | 1.0 | 1.1 | 0.1 | 10 | 1.0 |
| | 14 | 26 | 2.5 | 0.2 | 0.01 | 6 | 0.5 | 2 | 0.2 | 5.5 | 0.5 |
| | 15 | 6 | 0.01 | 6 | 0.6 | 0.2 | 0.01 | 1.2 | 0.1 | 14 | 1.5 |
| | 16 | 5 | 0.5 | 1 | .1 | 32 | 3.0 | 1.1 | 0.1 | 10 | 1.0 |
| | 17 | 6 | 0.6 | 1.5 | 0.1 | 21 | 2.0 | 0.2 | 0.01 | 0.8 | 0.08 |
| | 18 | 2.5 | 0.2 | 2 | 0.2 | 6 | 0.5 | 6 | 0.6 | 33 | 3.2 |
| | 19 | 16 | 1.5 | 2 | 0.2 | 14 | 1.5 | 3 | 0.3 | 18 | 1.7 |

The prime plating layers of Examples 20, 21, 22, 23 and 24 were the same as those of Examples 4, 5, 6, 7 and 8, respectively. The prime plating layers of Comparative Examples 15, 16 and 17 were the same as those of Comparative Examples 3, 4 and 5 respectively.

Table 6 shows the properties of the hard coating films of each of Examples 17-24 and Comparative Examples 13-19.

TABLE 6

| Property Sample | | film thickness (μm) | hardness (Hv) | Color Tone L* (%) | a* | b* | Evaluation of color tone | Adhesive ness | mar-proof property | Corrosion Resistance synthetic sweat | artificial seawater | hardness |
|---|---|---|---|---|---|---|---|---|---|---|---|---|
| Embodiments of Present invention | 17 | 2.7 | 2100 | 83 | −0.1 | 2.6 | ⊙ | ⊙ | ⊙ | ⊙ | ⊙ | ⊙ |
| | 18 | 2.25 | 2000 | 83 | −1.0 | −1.0 | ⊙ | ○ | ⊙ | ⊙ | ⊙ | ⊙ |
| | 19 | 3.65 | 1200 | 83 | 2.0 | 6.0 | ⊙ | ○ | ⊙ | ⊙ | ⊙ | ○ |
| | 20 | 4.45 | 2000 | 90 | 3.0 | 8.0 | ○ | ○ | ⊙ | ⊙ | ⊙ | ⊙ |
| | 21 | 3.55 | 1800 | 65 | −2.0 | −3.5 | ○ | ○ | ⊙ | ⊙ | ⊙ | ⊙ |
| | 22 | 4.9 | 2200 | 82 | −3.0 | −5.0 | ○ | ○ | ⊙ | ⊙ | ⊙ | ⊙ |
| | 23 | 2.3 | 1200 | 77 | 5.0 | 10.0 | ○ | ⊙ | ⊙ | ⊙ | ⊙ | ○ |
| | 24 | 5.0 | 2100 | 80 | −0.3 | 2.8 | ○ | ○ | ⊙ | ⊙ | ⊙ | ⊙ |
| Comparative Embodiments | 13 | 2.21 | 1900 | 62 | 1.0 | 4.0 | X black | X | ⊙ | ⊙ | ⊙ | ⊙ |
| | 14 | 3.71 | 900 | 91 | −0.2 | 2.8 | X too glittering | ⊙ | ⊙ | ⊙ | ⊙ | Δ |
| | 15 | 2.71 | 1700 | 65 | −3.4 | −5.5 | X bluish green | Δ | ⊙ | ⊙ | ⊙ | ⊙ |
| | 16 | 4.7 | 2100 | 67 | 5.6 | 12.1 | X reddish yellow | Δ | ⊙ | ⊙ | ⊙ | ⊙ |
| | 17 | 2.79 | 800 | 75 | −0.5 | 3.4 | X interference color | X much exfoliation | ⊙ | ⊙ | ⊙ | X |
| | 18 | 4.7 | 2100 | 80 | −0.3 | 2.8 | Δ clouded | Δ | ⊙ | ⊙ | ⊙ | ⊙ |
| | 19 | 5.2 | 2000 | 80 | −0.3 | 2.8 | ○ | X | ⊙ | ⊙ | ⊙ | ⊙ |

The symbols have the same meanings as shown in connection with Table 2.

All of the properties were measured as described above and similar results were obtained.

Each of mixed layers 5 and 7 had a thickness between about 0.05 and 0.5 μm and chromium nitride layer 6 had a thickness between about 0.05 and 3.0 μm.

EXAMPLES 25-32 AND COMPARATIVE EXAMPLES 20-26

Figure 4:
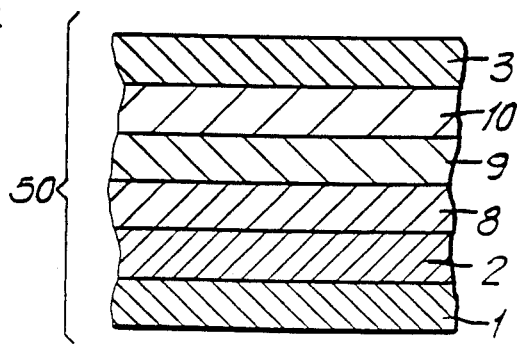
FIG. 4 is cross-sectional view of a coated article constructed and arranged in accordance with a still further alternate embodiment of the invention.

Reference is made to FIG. 4 which is cross-sectional view of a coated article 50 constructed and arranged in accordance with another embodiment of the invention. Coated article 50 includes a substrate 1, a metallic chromium layer 2 on substrate 1, a first mixed layer 8 of metallic chromium and chromium carbide on metallic chromium layer 2, a layer of chromium carbide 9 on first mixed layer 8, a second mixed layer 10 of chromium carbide and chromium nitride carbide on chromium carbide layer 9, and a layer of chromium nitride carbide 3 on second mixed layer 10.

The substrates were selected of the materials shown in Table 7A and cleaned as described in Examples 1-8 and Comparative Examples 1-5. The substrates were prime coated as shown in Table 7A and a layer of metallic chromium was deposited on substrate 1 as described.

Acetylene gas was gradually introduced into the vacuum chamber at a predetermined rate until the pressure indicated in Table 7A was achieved. When the gas pressure stablized, the layer produced was a mixed layer 8 of metallic chromium and chromium carbide. When the acetylene gas pressure becomes constant, ion plating is again conducted for a predetermined period of time and a chromium carbide layer 9 was formed on mixed layer 8 of metallic chromium and chromium carbide. Then a mixed gas of chromium nitride and acetylene was gradually introduced into the vacuum chamber at a predetermined ratio and a second mixed layer 10 of chromium carbide and chromium nitride carbide was formed on chromium carbide layer 9. Finally, when the pressure of the mixed nitrogen and acetylene gas reached a predetermined value, ion plating was again conducted for a predetermined period of time and a chromium nitride carbide layer 3 was producted on second mixed layer 10 of chromium carbide and chromium nitride carbide.

Tables 7A and 7B show the hard coating films of each of Examples 25-32 and Comparative Examples 20-26 were formed.

TABLE 7A

| Property Samples | | Material | Prime-coating | Forming a coating film Treating time | $N_2/C_2H_2$ ratio | gas pressure (torr) |
|---|---|---|---|---|---|---|
| Embodiments of Present Invention | 25 | SUS 304 | not including | 27 | 1.0 | $5 \times 10^{-4}$ |
| | 26 | SUS 304 | not including | 24.8 | 3.0 | $5 \times 10^{-4}$ |
| | 27 | SUS 316L | not including | 38.3 | 1/4 | $5 \times 10^{-4}$ |
| | 28 | SUS 303B | including | 46.1 | 1/7 | $2 \times 10^{-4}$ |
| | 29 | SUS 303B | including | 37.2 | 7.0 | $9 \times 10^{-4}$ |
| | 30 | brass | including | 50 | 10.0 | $6 \times 10^{-4}$ |
| | 31 | brass | including | 24.6 | 1/10 | $6.5 \times 10^{-4}$ |
| | 32 | zinc | including | 52.5 | 1.0 | $6 \times 10^{-4}$ |
| Comparative | 20 | SUS | not | 24.9 | 1/2 | $1 \times 10^{-3}$ |

TABLE 7A-continued

|  |  |  | Forming a coating film | | |
|---|---|---|---|---|---|
| Property Samples | Material | Prime-coating | Treating time | $N_2/C_2H_2$ ratio | gas pressure (torr) |
| Embodiments | 304 | including | | | |
| 21 | SUS 316L | not including | 40.2 | 1.0 | $8 \times 10^{-5}$ |
| 22 | SUS 303B | including | 28.7 | $N_2$ only | $9 \times 10^{-4}$ |
| 23 | brass | including | 49 | $C_2H_2$ only | $9 \times 10^{-4}$ |
| 24 | brass | including | 30.1 | 1.0 | $5 \times 10^{-4}$ |
| 25 | SUS 303B | not including | 47.5 | 1.0 | $6 \times 10^{-4}$ |
| 26 | SUS 303B | not including | 53.6 | 1.0 | $6 \times 10^{-4}$ |

The prime plating layers of Examples 28, 29, 30 and 32 were the same as those of Examples 4, 5, 6, 7 and 8, respectively. The prime plating layers of Comparative Examples 22, 23 and 24 were the same as those of Comparative Examples 3, 4 and 5 respectively.

The symbols have the same meanings as shown in connection with Table 2.

All of these results are similar to those obtained in Examples 17–24 and Comparative Examples 13–19. Use of chromium carbide as an intermediate layer had the

TABLE 7B

| Property (layer No.) Sample | | first layer (2) | | second layer (8) | | third layer (9) | | fourth layer (10) | | fifth layer (3) | |
|---|---|---|---|---|---|---|---|---|---|---|---|
| | | forming time (min.) | thickness of film (μm) | forming time (min.) | thickness of film (μm) | forming time (min.) | thickness of film (μm) | forming time (min.) | thickness of film (μm) | forming time (min.) | thickness of film (μm) |
| Embodiments of Present Invention | 25 | 5.0 | 0.5 | 1 | 0.1 | 10 | 1.0 | 1 | 0.1 | 10 | 1.0 |
| | 26 | 0.6 | 0.05 | 1 | 0.1 | 12 | 1.1 | 1.2 | 0.1 | 10 | 1.0 |
| | 27 | 20 | 2.0 | 0.6 | 0.05 | 5 | 0.5 | 2.1 | 0.2 | 11 | 1.1 |
| | 28 | 8 | 0.8 | 5 | 0.5 | 21 | 2.0 | 0.6 | 0.05 | 11.5 | 1.1 |
| | 29 | 8.5 | 0.8 | 2.1 | 0.2 | 0.6 | 0.05 | 3 | 0.3 | 23 | 2.2 |
| | 30 | 6 | 0.6 | 2 | 0.2 | 31 | 3.0 | 1 | 0.1 | 10 | 0.9 |
| | 31 | 6 | 0.6 | 2.1 | 0.2 | 10 | 0.9 | 5.5 | 0.5 | 1 | 0.1 |
| | 32 | 6.5 | 0.6 | 1 | 0.1 | 11 | 1.1 | 2 | 0.2 | 32 | 3.0 |
| Comparative Embodiments | 20 | 0.2 | 0.01 | 1.1 | 0.1 | 11.5 | 1.1 | 1.1 | 0.1 | 11 | 1.0 |
| | 21 | 26 | 2.5 | 0.2 | 0.01 | 6 | 1.1 | 2 | 0.2 | 6 | 0.6 |
| | 22 | 6.5 | 0.6 | 7 | 0.6 | 0.2 | 0.01 | 1 | 0.1 | 14 | 1.3 |
| | 23 | 6 | 0.6 | 2.5 | 0.2 | 30 | 3.0 | 1 | 0.1 | 9.5 | 1.0 |
| | 24 | 7 | 0.7 | 2 | 0.2 | 20 | 1.9 | 0.2 | 0.01 | 0.9 | 0.08 |
| | 25 | 3 | 0.3 | 1 | 0.1 | 3.5 | 0.3 | 7 | 0.6 | 33 | 3.2 |
| | 26 | 16 | 1.5 | 2.1 | 0.2 | 16 | 1.5 | 3.5 | 0.3 | 16 | 1.7 |

Table 8 shows the properties of the hard coating films of each of Examples 25-= and Comparative Examples 20-26.

same effect on the hard coating film as a chromium nitride intermediate layer. However, the five layer hard coating films had superior adherence as compared to

TABLE 8

| Property Samples | | Property of a coating film | | | | | Evaluation Property | | | | | |
|---|---|---|---|---|---|---|---|---|---|---|---|---|
| | | film thickness (μm) | hardness (Hv) | color tone | | | Evaluation of Color Tone | Adhesiveness | Mar-proof property | Corrosion Resistance | | herdness |
| | | | | L* (%) | a* | b* | | | | synthetic sweat | artificial seawater | |
| Embodiments of Present Invention | 25 | 2.7 | 2100 | 83 | −0.1 | 2.6 | ⊚ | ⊚ | ⊚ | ⊚ | ⊚ | ⊚ |
| | 26 | 2.35 | 2000 | 83 | −1.0 | −1.0 | ⊚ | ○ | ⊚ | ⊚ | ⊚ | ⊚ |
| | 27 | 3.85 | 1200 | 83 | 2.0 | 6.0 | ⊚ | ○ | ⊚ | ⊚ | ⊚ | ○ |
| | 28 | 4.45 | 2000 | 90 | 3.0 | 8.0 | ○ | ○ | ⊚ | ⊚ | ⊚ | ⊚ |
| | 29 | 3.55 | 1800 | 65 | −2.0 | −3.5 | ○ | ○ | ⊚ | ⊚ | ⊚ | ⊚ |
| | 30 | 2.1 | 2200 | 82 | −3.0 | −5.0 | ○ | ○ | ⊚ | ⊚ | ⊚ | ⊚ |
| | 31 | 2.3 | 1200 | 77 | 5.0 | 10.0 | ○ | ⊚ | ⊚ | ⊚ | ⊚ | ○ |
| | 32 | 5.0 | 2100 | 80 | −0.3 | 2.8 | ⊚ | ○ | ⊚ | ⊚ | ⊚ | ⊚ |
| Comparative Embodiments | 20 | 2.31 | 1900 | 62 | 1.0 | 4.0 | X black | X | ⊚ | ⊚ | ⊚ | ⊚ |
| | 21 | 3.91 | 900 | 91 | −0.2 | 2.8 | X glittering | ⊚ | ⊚ | ⊚ | ⊚ | Δ |
| | 22 | 2.61 | 1700 | 65 | −3.4 | −5.5 | X bluish green | Δ | ⊚ | ⊚ | ⊚ | ⊚ |
| | 23 | 4.9 | 2100 | 67 | 5.6 | 12.1 | X reddish yellow | Δ | ⊚ | ⊚ | ⊚ | ⊚ |
| | 24 | 2.89 | 800 | 75 | −0.5 | 3.4 | X | X much exfoliation | ⊚ | ⊚ | ⊚ | X |
| | 25 | 4.9 | 2100 | 80 | −0.3 | 2.8 | Δ clouded | Δ | ⊚ | ⊚ | ⊚ | ⊚ |
| | 26 | 5.2 | 2000 | 80 | −0.3 | 2.8 | ⊚ | X | ⊚ | ⊚ | ⊚ | ⊚ | the three layer hard coating films of Examples 9-16 and the two layer hard coating films of Examples 1-8.

As has been shown, superior hard coating films having excellent properties and color tones similar to that of stainless steel can be provided in accordance with the invention. Hard coating films having a five layer structure have superior adherence as compared to a substrate than films having a three layer structure. Similarly, films having a three layer structure have superior adherence to films having a two layer structure. However, all of these films ar useful and practical.

When the surface of the substrate is processed so that it has a fold pattern, lattice pattern, adventurine pattern, mirror finish or the like, the hard coating film is formed on the processed surface. A color tone similar to that of the processed substrate without any hard coating film can be obtained. The hard coating layer has the substantially the same color tone as that of an SUS 304 substrate. However, superior damage resistance properties are obtained.

Polishing processes such a buffing can be conducted on the hard coating film and it is possible to achieve an excellent glossy appearance. The brightness and color tone is affected by the gas pressure as shown in the Examples.

When products produced by individual ion plating processes are examined by the naked eye, the difference between them can not be recognized. High accuracy of color tone can be achieved with repeated processing. Furthermore, the techniques of the invention can be used for ornamental members for a watch or timepiece as well as for glass frames, lighter cases, ornamental bands, buckles, tie pins, rings, spoons and forks.

Accordingly, superior decorative members having a color tone similar to that of stainless and having mar proof properties, good adherence and good corrosion resistance can be provided. Additionally, the initial ornamental appearance is maintained for an extended period of time.

It will thus be seen that the objects set forth above, among those made apparent from the preceding description, are efficiently attained and, since certain changes may be made in carrying out the above method and in the construction set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A coated article having a hard outer coating film on a substrate, comprising:
    a metallic chromium layer disposed on the substrate; and
    an outer layer of chromium nitride carbide on the metallic chromium layer to form the hard coating film.

2. The coated article of claim 1, further including a mixed layer of metallic chromium and chromium nitride carbide disposed between the metallic chromium layer and the outer layer.

3. The coated article of claim 1, further including a first mixed nitride layer of metallic chromium and chromium nitride on the metallic chromium layer, a chromium nitride layer on the first mixed nitride layer and a second mixed nitride layer of chromium nitride and chromium nitride carbide on the chromium nitride layer and below the outer layer.

4. The coated article of claim 1, further including a first mixed carbide layer of metallic chromium and chromium carbide on the metallic chromium layer, a chromium carbide layer on the first mixed carbide layer and a second mixed carbide layer of chromium carbide and chromium nitride carbide on the chromium carbide layer and below the outer layer.

5. The coated article of claim 1, wherein the total thickness of the hard coating film is between about 0.15 and 5.0 $\mu$m.

6. The coated article of claim 1., wherein the metallic chromium layer has a thickness between about 0.05 and 2.0 $\mu$m.

7. The coated article of claim 1, wherein the thickness of the chromium nitride carbide layer is between about 0.1 and 3.0 $\mu$m.

8. The coated article of claim 2, wherein the mixed layer has a thickness between about 0.05 and 0.5$\mu$m.

9. The coated article of claim 3, wherein at least one of the mixed nitride layers has a thickness between about 0.05 and 0.5 $\mu$m.

10. The coated article of claim 3, wherein the chromium nitride layer has a thickness between about 0.05 and 3.0 $\mu$m.

11. The coated article of claim 4, wherein at least one of the mixed carbide layers has a thickness between about 0.05 and 0.5 $\mu$m.

12. The coated article of claim 4, wherein the chromium carbide layer has a thickness between about 0.05 and 3.0 $\mu$m.

13. The coated article of claim 1, wherein the color tone of the chromium nitride carbide layer is represented by:

$$65 \leq L^* \leq 90;$$

$$-3 \leq a^* \leq 5; \text{ and}$$

$$-5 \leq b^* \leq 10.$$

14. The coated article of claim 1, wherein the color tone of the chromium nitride carbide layer is represented by:

$$72 \leq L^* \leq 83;$$

$$-1 \leq a^* \leq 2;$$

$$-1 \leq b^* \leq 6.$$

15. The coated article of claim 1, wherein the color tone of the chromium nitride carbide layer is similar to the color tone of stainless steel.

16. The coated article of claim 1, wherein the hard coating film has a hardness of greater than about 1200 Hv.

17. The coated article of claim 1, wherein the substrate is a corrosion resistant material.

18. The coated article of claim 17, wherein the substrate is selected from the group consisting of ceramic, cemented carbide, nickel group alloys, cobalt group alloys, stainless steel, copper alloys, zinc, zince alloy and plastic.

19. The coated article of claim 1, wherein a prime-coating layer is formed on the substrate prior to coating the substrate with a metallic chromium layer.

20. The coated article of claim 19, wherein the prime-coating layer is selected from the group consisting of gold, gold alloys, palladium, palladium alloys, ruthenium, rhodium, nickel, nickel alloys and mixtures thereof.

21. The coated article of claim 19, wherein the prime coating layer has a thickness between about 0.2 and 10 $\mu$m.

* * * * *